(12) United States Patent
Komuro

(10) Patent No.: US 7,994,048 B2
(45) Date of Patent: Aug. 9, 2011

(54) METHOD OF MANUFACTURING A THROUGH ELECTRODE

(75) Inventor: Masahiro Komuro, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1022 days.

(21) Appl. No.: 11/765,696

(22) Filed: Jun. 20, 2007

(65) Prior Publication Data

US 2007/0243706 A1    Oct. 18, 2007

Related U.S. Application Data

(62) Division of application No. 11/092,703, filed on Mar. 30, 2005, now abandoned.

(30) Foreign Application Priority Data

Mar. 30, 2004  (JP) ................................. 2004-099681

(51) Int. Cl.
  *H01L 21/44*  (2006.01)
  *H01L 21/4763*  (2006.01)
(52) U.S. Cl. ......... 438/629; 438/631; 438/667; 438/672
(58) Field of Classification Search .................. 438/629, 438/631, 667, 672
  See application file for complete search history.

(56) References Cited

U.S. PATENT DOCUMENTS

| | | | |
|---|---|---|---|
| 5,633,204 A | 5/1997 | Tago et al. | |
| 6,087,719 A | 7/2000 | Tsunashima | |
| 6,114,240 A | 9/2000 | Akram et al. | |
| 6,323,546 B2 * | 11/2001 | Hsuan et al. | 257/686 |
| 6,426,880 B1 * | 7/2002 | Chen | 361/773 |
| 6,696,757 B2 * | 2/2004 | Yunus et al. | 257/735 |
| 6,929,978 B2 * | 8/2005 | Anderson | 438/108 |
| 7,115,972 B2 * | 10/2006 | Dotta et al. | 257/621 |
| 7,208,838 B2 * | 4/2007 | Masuda | 257/774 |
| 2001/0036724 A1 * | 11/2001 | Ahn | 438/623 |
| 2002/0110953 A1 | 8/2002 | Ahn et al. | |
| 2003/0038344 A1 | 2/2003 | Palmer et al. | |
| 2004/0041260 A1 * | 3/2004 | Wood et al. | 257/734 |

(Continued)

FOREIGN PATENT DOCUMENTS

JP            1-258457         10/1989

(Continued)

OTHER PUBLICATIONS

Notification of Second Office Action in Chinese dated Dec. 7, 2007.

(Continued)

*Primary Examiner* — Matthew C Landau
*Assistant Examiner* — James M Mitchell
(74) *Attorney, Agent, or Firm* — Young & Thompson

(57) ABSTRACT

A through electrode that offers excellent performance and can be manufactured through a simple process is to be provided. In a silicon spacer including a silicon substrate, an insulative thick film is provided so as to be in contact with a surface of the silicon substrate and a side wall of a through hole penetrating the silicon substrate. An upper surface of a through plug is retreated to a lower level than an interface between the silicon substrate and the insulative thick film, thus to define a height gap. A first bump is then formed, which is connected to the retreated surface of the through plug and has a larger diameter than that of the through plug at the upper surface of the insulative thick film.

5 Claims, 10 Drawing Sheets

U.S. PATENT DOCUMENTS

| | | | |
|---|---|---|---|
| 2004/0245623 A1* | 12/2004 | Hara et al. | 257/698 |
| 2005/0186791 A1* | 8/2005 | Hiatt | 438/667 |
| 2009/0032942 A1* | 2/2009 | Choi | 257/737 |
| 2010/0044863 A1* | 2/2010 | Kasai et al. | 257/738 |
| 2010/0059881 A1* | 3/2010 | Kim et al. | 257/737 |

FOREIGN PATENT DOCUMENTS

| | | |
|---|---|---|
| JP | 10-223833 | 8/1998 |
| JP | 11-345933 | 12/1999 |
| JP | 2001-168529 | 6/2001 |
| JP | 2002-237468 | 8/2002 |
| JP | 2004-221350 | 8/2004 |

OTHER PUBLICATIONS

H. Yonemura at al., "Time-modulated Cu-Plating technique for Fabricating High-Aspect-Radio Voas for Three-Dimensional Stacked LSI System", Conference Proceedings ULSI XVIII 2003 Materials Research Society, pp. 75-80.

Japanese Official Action—2004-099681—Feb. 22, 2011.

* cited by examiner

METHOD OF MANUFACTURING A THROUGH ELECTRODE

This application is based on U.S. patent application Ser. No. 11/092,403 filed Mar. 30, 2005 and Japanese patent application No. 2004-099681, the content of which is incorporated hereinto by reference.

BACKGROUND OF THE INVENTION

1. Field of the Invention

The present invention relates to a through electrode, a spacer provided with the through electrode, and a method of manufacturing them.

2. Related Art

In recent years, with the view of achieving an even higher degree of integration of a semiconductor chip, development of three-dimensional implementation of semiconductor chips such as an LSI has lately been vigorously carried out. Such attempts include providing a through electrode on a semiconductor substrate. An example of the through electrode is disclosed in the H. Yonemura, et al., "Time-Modulated Cu-Plating Technique for Fabricating High-Aspect-Ratio Vias for Three-dimensional Stacked LSI System", 2002, Proceedings of the International Interconnect Technology Conference, pp. 75 to 77 (H. Yonemura, et al.). The document discloses a through electrode constituted of a Cu plug formed so as to penetrate a silicon substrate, with a bump formed on an upper face of the Cu plug. Providing such through electrode allows achieving electrical connection between the substrates and an external component via a short distance without the need of performing wire bonding, when three-dimensionally stacking a plurality of semiconductor chip substrates.

SUMMARY OF THE INVENTION

However, as a result of the review on the cited technique made by the present inventors, it has now been discovered that sufficient secure of adhesion between a metal film and the bump constituting the through electrode has still room for improvement. In addition, a room for further simplification has been found in the manufacturing process of the through electrode.

According to the present invention, there is provided a through electrode comprising a silicon substrate provided with a through hole; an insulating protective film formed on a surface of the silicon substrate with an opening connecting with the through hole; a through plug formed by embedding a conductive material in the through hole; and a bump connected to the through plug; wherein the bump is connected to the through plug inside the through hole, and a portion of the bump located outside the through hole has a larger diameter than that of a portion of the bump located inside the through hole. In such configuration, the bump may be connected to the through plug on the surface of the substrate.

In the through electrode thus constructed, the bump is connected to the through plug inside the through hole penetrating the silicon substrate. This means that a recessed portion is formed on the silicon substrate, and it is in the recessed portion that the through plug and the bump are connected. Also, the bump has a larger diameter outside the through hole. Accordingly, the bump and the through plug are tightly adhered because of an anchoring effect. Further, the electrical contact between the bump and the through plug is fully secured, which leads to decrease of contact resistance therebetween. In addition, since the insulating protective film is provided, the bump can be kept from directly contacting with the silicon substrate on the surface where the through electrode is formed.

In the present invention, the conductive material may be made of a metal material. This further assures the conductivity of the through electrode.

In the through electrode according to the present invention, the larger-diameter portion of the bump may be in contact with the insulating protective film. Such configuration can keep the bump from contacting with the silicon substrate. This enhances the reliability of the electrode in its essential performance.

The through electrode according to the present invention may further comprise a side wall insulating film formed so as to cover a side wall of the through plug. Such configuration allows suppressing generation of a parasitic capacitance in the silicon substrate along the side periphery of the through electrode. This further increases the reliability of the through electrode.

In the through electrode according to the present invention, the side wall insulating film and the insulating protective film may be continuously and integrally formed. Such configuration allows manufacturing the configuration by simple process.

The term "continuously and integrally formed" herein means forming a continuous and unified structure. Preferably, the structure is constituted of a single part without forming a joint portion. Forming a continuous and unified structure allows preventing the side wall insulating film and the insulating protective film from separating or detachment from each other. Accordingly, such constitution further assures insulating property and further increases the reliability of the electrode.

In the through electrode according to the present invention, the through plug may include a barrier film covering a side wall inside the through hole, and a metal film around covered by the barrier film. In the present invention, the barrier film serves as an insulating film that prevents diffusion of a metal component contained in the metal film into outward of the through plug. Such configuration effectively prevents the diffusion of a metal component in the metal film into the semiconductor substrate.

According to the present invention, there is provided a method of manufacturing a through electrode, comprising forming a hole on one surface of a silicon substrate; forming an insulating film that covers the surface and an inner wall of the hole; forming a conductive film so as to fill the hole; performing polishing or etching back on the conductive film so as to remove a portion of the conductive film formed outside the hole for exposing the insulating film, and to retreat a surface of the conductive film into an inner level of the silicon substrate than the surface thereof, for forming a conductive plug and a recessed portion; growing a metal film on a retreated surface of the conductive plug thus to fill the recessed portion and to further form a bump having a larger diameter outside the hole than that of a portion of the bump located inside the hole; and polishing another surface of the silicon substrate for exposing the conductive plug, thus to form a through electrode.

The method of manufacturing thus arranged includes retreating the surface of the conductive film into an inner level of the silicon substrate than the surface thereof, thus to form the recessed portion, that is, the retreated portion on the surface of the silicon substrate, thereby forming a height gap on these surfaces. Therefore, such recessed portion assures the connection of the conductive plug and the bump. Also, such method eliminates the need to form an insulating film on the silicon substrate surface and to form an opening thereon at a determined position, when forming the bump. Accordingly, a through electrode that offers excellent property can be stably manufactured through a simplified process, and hence a manufacturing cost is decreased.

In the present invention, the insulating film may be formed as a thick film. Such configuration further assures the insulation between the through electrode and the silicon substrate, and the prevention of generation of a parasitic capacitance in the silicon substrate.

In the method of manufacturing according to the present invention, forming the bump may include growing the metal film selectively on the retreated surface of the conductive plug. Having such process, the configuration of the bump, which effectively has adhesion between the bump and the through plug, may be further obtained by an anchoring effect.

In the method of manufacturing according to the present invention, forming the bump may include forming a barrier metal film on the surface of the conductive plug and a side wall of the recessed portion, and growing the metal film utilizing the barrier metal film as the base. Such method further assures the electrical contact between the conductive plug and the bump. Also, the metal film may be more assuredly grown from the surface of the conductive plug and the side surface of the recessed portion. Accordingly, a stability of manufacturing the bump may be increased.

The method of manufacturing according to the present invention may comprise, after forming the conductive plug, selectively removing a portion of the silicon substrate from another surface thereof opposite to the one surface thus to expose a surface of the conductive plug; and growing another metal film on an exposed surface of the conductive plug, thus to form a bump on the rear surface.

Alternatively, the method of manufacturing according to the present invention may comprise, after forming the through electrode, growing another metal film on an exposed surface of the conductive plug, thus to form a bump on the rear surface.

In the present invention, since the inner wall of the hole is covered with the insulating film, the bump on the rear surface may be formed without additionally forming another insulating film for forming the bump on the rear surface, that is, another surface of the silicon insulator. This allows simplifying the manufacturing process, and hence facilitating the manufacturing of the through electrode more easily. Here, in the present invention, the metal film from which to form the bump and the metal film from which to form another bump on the rear surface may be constituted of an identical material or different materials.

In the method of manufacturing according to the present invention, forming the insulating film may include forming a silicon oxide film on the one surface of the silicon substrate. Such method further assures insulation and protection of the surface of the silicon substrate. In addition, such method further ensures suppression of generation of a parasitic capacitance in the silicon substrate along the side periphery of the through hole.

The method of manufacturing according to the present invention may comprise forming a barrier film on the one surface of the silicon substrate provided with the hole, after forming the insulating film and before forming the conductive film. Such method allows effectively inhibiting the conductive material in the conductive film from diffusing into the silicon substrate.

According to the present invention, there is provided a silicon spacer comprising the through electrode.

According to the present invention, there is provided a method of manufacturing a silicon spacer, comprising forming a through electrode by the foregoing method of manufacturing the through electrode.

The silicon spacer according to the present invention includes the through electrode formed as specified above. Accordingly, the conductive plug and the bump are tightly adhered to each other, and an electrical conductive path is adequately secured in a cross-sectional direction of the silicon substrate. Therefore, such spacer can be advantageously provided between a plurality of semiconductor devices to be three-dimensionally stacked, for assured electrical connection between those devices.

As described above, the present invention provides a through electrode that offers excellent property and can be manufactured through a simple process, wherein a through plug formed by embedding a conductive material in a through hole penetrating a silicon substrate and a bump are connected with the through plug inside the through hole, and the bump has a larger-diameter portion outside the through hole.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

Firstly, a spacer provided with a through electrode according to the present invention will be described. The spacer is to be disposed between three-dimensionally stacked semiconductor devices formed on a substrate, for securing an electrical connection.

Figure 7:
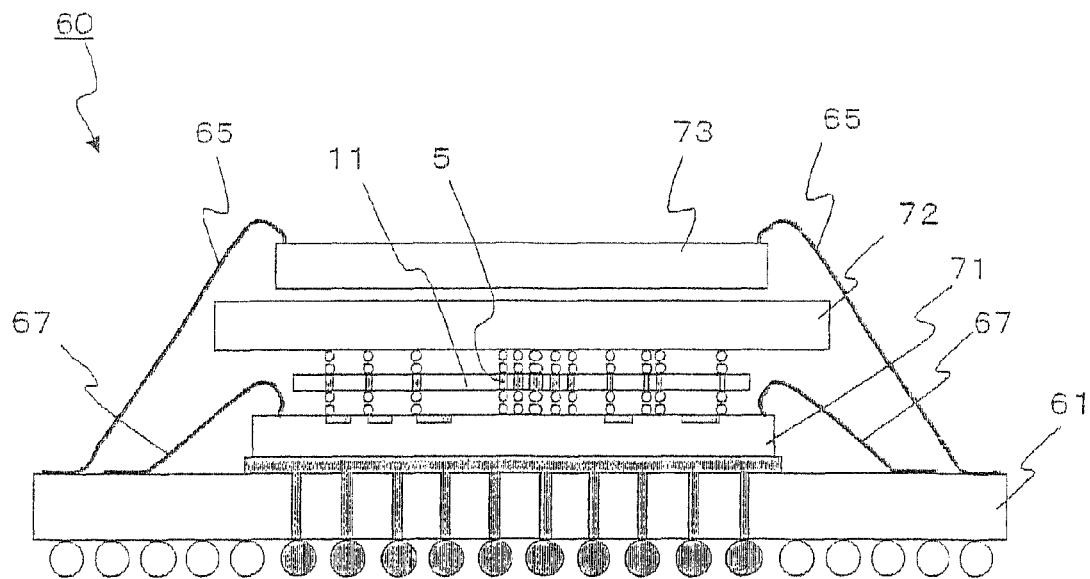
FIG. 7 is a schematic cross-sectional view showing a configuration of a semiconductor device including a silicon spacer, according to the embodiment.

FIG. 7 is a schematic cross-sectional view showing a configuration of a semiconductor device on which a plurality of chips is stacked. The semiconductor device 60 shown in FIG. 7 includes an MPU/ASIC chip 71, a large capacitance system memory chip 72, and a 128MNOR flush memory chip 73 stacked in this sequence on a base substrate 61, and the substrate 61 and the chip 71 are connected via a bonding wire 67, and the substrate 61 and the chip 73 are connected via a bonding wire 65.

Normally the semiconductor chip on the second layer from the base substrate is required to be smaller in dimensions than that on the first layer from the base substrate, in order to secure a room for disposing the bonding wire for connection, which naturally imposes a limitation to a capacitance and property of the semiconductor chip to be stacked.

However, even when the second layer chip 72 is larger than the first layer chip 71 as shown in FIG. 7, interposing a spacer 11 therebetween and thus connecting electrodes via through electrode 5 generates a space between the first layer chip 71 and the second layer chip 72, thereby allowing disposing the bonding wire 67 for the connection.

The spacer according to the present invention, which is provided with the through electrode, can be advantageously incorporated in such semiconductor devices. Hereunder, an embodiment of the spacer including the through electrode will be described referring to the drawings. Here, with respect to all the drawings, constituents employed in common will be given an identical numeral, and the description thereof will be omitted as the case may be. Also, for the purpose of the description of the embodiment, a surface of the spacer on which the retreated surface of the through plug constituting the through electrode will be referred to as an upper face (surface), and the opposite surface as a lower face (rear face).

Figure 1:
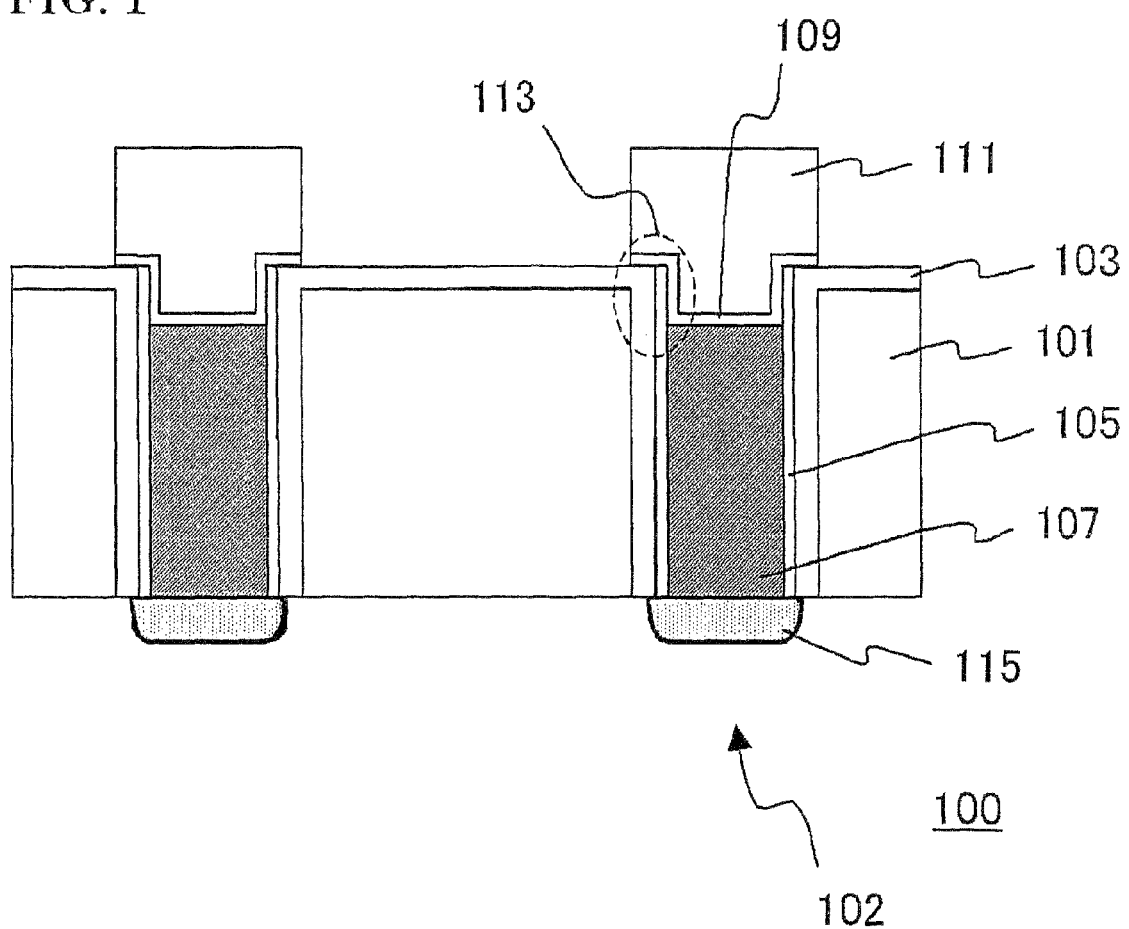
FIG. 1 is a schematic cross-sectional view showing a configuration of a silicon spacer according to an embodiment of the present invention.

FIG. 1 is a schematic cross-sectional view showing a configuration of a silicon spacer according to this embodiment. A silicon spacer 100 shown in FIG. 1 includes a through electrode 102 penetrating a silicon substrate 101, which is a semiconductor substrate, from the upper face to the lower face thereof. Although FIG. 1 shows a configuration in which the single silicon substrate 101 includes two through electrodes 102, the number of the through electrodes 102 or a position thereof is not specifically limited, but may be appropriately determined according to a configuration of the semiconductor devices to which the silicon spacer 100 is to be incorporated.

On the upper face of the silicon substrate 101 and on the inner side face of the through hole penetrating the silicon substrate 101, an insulative thick film 103 is provided in contact with the silicon substrate 101. Inside the through hole penetrating the silicon substrate 101, the insulative thick film 103, a SiN film 105, and a through plug 107 are filled in this sequence. Accordingly, the side wall of the through plug 107 is covered with the insulative thick film 103 via the SiN film 105, thus separated from the silicon substrate 101.

A material for constituting the insulative thick film 103 is to be selected out of those that are stable against treatments to be performed in the manufacturing process of the through electrode 102 to be later described. Also, preferably the material of the insulative thick film 103 is selected material capable of suppressing generation of a parasitic capacitance in the silicon substrate 101. For example, a $SiO_2$ film or the like is preferably employed. Likewise, a thickness of the insulative thick film 103 is preferably determined so as to secure stability under the manufacturing process of the through electrode 102 and to allow suppressing generation of a parasitic capacitance. When employing the $SiO_2$ film as the insulative thick film 103, a thickness thereof may be, for example, from 300 nm to 5 μm. With a thickness of 300 nm or greater, degradation of the through electrode 102 during the manufacturing process can be effectively prevented. Accordingly, emergence of a leak current, caused by a contact of the silicon substrate 101 and the first bump 111 or the second bump 115, can be securely prevented. With a thickness of 5 μm or less, the silicon spacer 100 and the through electrode 102 can be formed to be smaller and thinner.

The through electrode 102 includes the through plug 107, an under bump metal film 109, a first bump 111, a second bump 115, and a SiN film 105. The through plug 107 serves as a conductive material embedded inside the through hole formed in the silicon substrate 101. A material of the through plug 107 may be a metal such as copper. The first bump 111 is formed in contact with the upper face of the through plug 107 via the under bump metal film 109.

The SiN film 105 serves as a barrier film covered on the side wall of the through plug 107, for preventing diffusion of a metal component in the through plug 107 into the insulative thick film 103 and the silicon substrate 101. The barrier film may be formed of a material other than the SiN, as long as it is an insulative material. Here, the SiN film 105 is thinner than the insulative thick film 103. A thickness of the SiN film 105 may be, for example, 10 nm or greater. Such thickness assures proper property of the barrier film.

The upper face of the through plug 107 is located at an inner level inside the through hole, than an interface between the silicon substrate 101 and the insulative thick film 103, thus forming a height gap 113 between those faces. The retreated space of the through plug 107 is filled with a portion of the first bump 111, by which the through plug 107 is in contact with the first bump 111 at the retreated face from the interface between the silicon substrate 101 and the insulative thick film 103, that is, at the recessed portion. The first bump 111 is outwardly expanding outside the through hole in an eaves-like shape, forming an approximately T-shaped cross section. In other words, a diameter of the first bump 111 located outside the through hole is larger than a diameter of the first bump 111 located inside the through hole. The first bump 111 may be constituted of a metal, such as Au.

The second bump 115 is disposed in contact with the lower face of the through plug 107. The second bump 115 is formed within the contact face between the insulative thick film 103 and the silicon substrate 101. Accordingly, the second bump 115 is securely kept from making an electrical connection with the silicon substrate 101. The second bump 115 may be constituted of a metal, such as Ni. The second bump 115 may be provided with a metal coating layer such as Au, on the surface thereof.

A method of manufacturing the silicon spacer 100 will now be described. FIGS. 2A to 2C, 3D to 3F, 4G, 4H, and FIG. 5I are schematic cross-sectional views showing the manufacturing process of the silicon spacer 100.

Figure 2A:
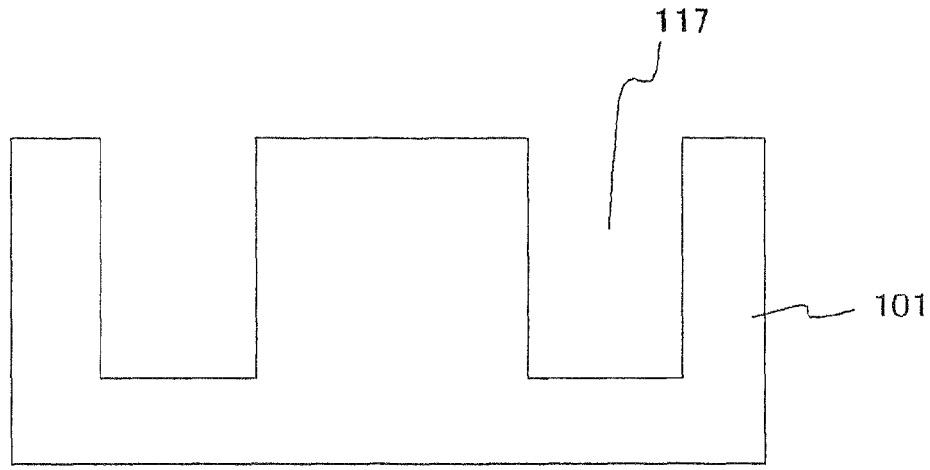
FIGS. 2A to 2C are schematic cross-sectional views for explaining a manufacturing process of the silicon spacer of FIG. 1.

Firstly, a photoresist is applied to a surface of the silicon substrate 101, and photolithography is performed to form a resist pattern in which an opening is formed at a position corresponding to the through plug 107. Then etching is performed utilizing the resist pattern as a mask, to remove a portion of the silicon substrate 101, thus to form an opening 117 (FIG. 2A).

After removing the photoresist, the insulative thick film 103 is formed all over the upper face of the silicon substrate

Figure 2B:
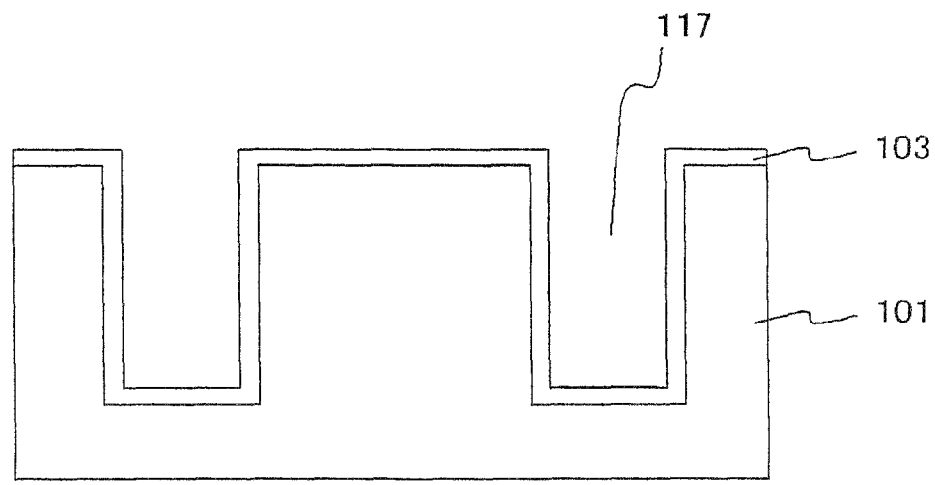
Figure 2C:
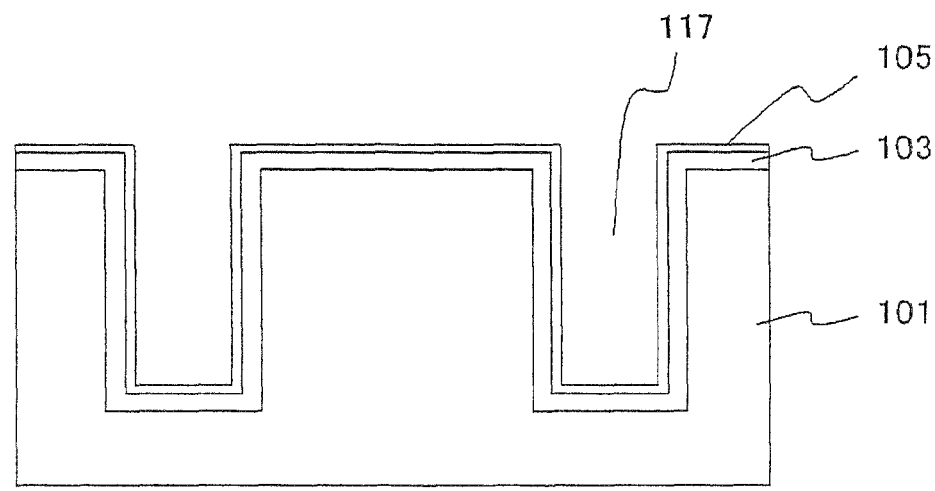

101, including the opening 117 (FIG. 2B). The insulative thick film 103 may be an SiO$_2$ film deposited by a CVD technique. Then the SiN film 105, which is to serve as a barrier film, is formed all over the upper face of the silicon substrate 101 on which the insulative thick film 103 is provided, in a thickness of for example 50 nm by a plasma CVD technique (FIG. 2C).

Figure 3D:
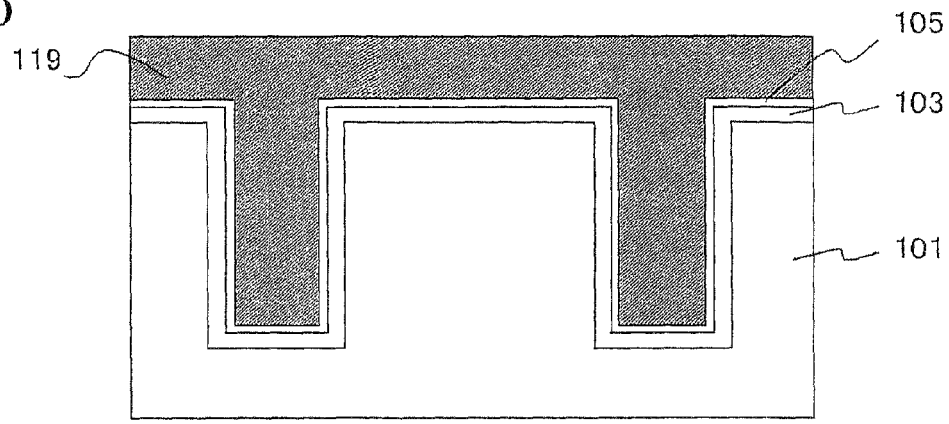
FIGS. 3D to 3F are schematic cross-sectional views for explaining a manufacturing process of the silicon spacer of FIG. 1.

Thereafter, a seed Cu film (not shown in the drawings) is formed on the SiN film 105. Then electrolytic plating is carried out to completely fill the opening 117 with a Cu film, and annealing is performed to grow the grains of Cu. At this stage, formation of the Cu film 119 is completed (FIG. 3D).

Figure 3E:
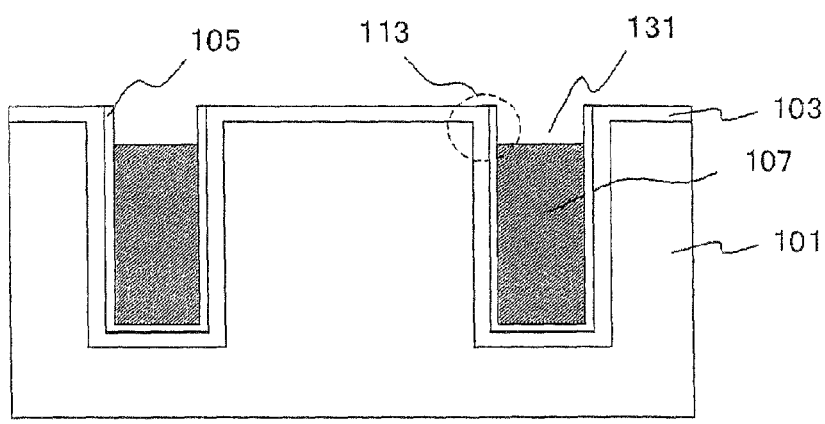

The above is followed by a CMP (Chemical Mechanical Polishing) process, by which the Cu film 119 and the SiN film 105 are removed from the upper face of the silicon substrate 101. Here, conditions of the CMP process are selected such that the upper face of the Cu film 119 falls to an lower level than the contact face between the silicon substrate 101 and the insulative thick film 103 (FIG. 3E). Specifically, slurry is to be appropriately selected such that the chemical polishing due to the oxidation of the Cu film 119 takes place with priority to the mechanical polishing of the insulative thick film 103.

Accordingly, the Cu film 119 is polished with priority while leaving the insulative thick film 103 not removed on the silicon substrate 101, thus forming the height gap 113 (recess) between the upper face of the Cu film 119 and the interface between the silicon substrate 101 and the insulative thick film 103. In this way a recessed portion 131 is defined in a portion of the opening 117, by depressing the Cu film 119 such that the upper face thereof is located lower than the upper face of the insulative thick film 103. Therefore a bottom portion of the recessed portion 131 corresponds to the retreated face, that is, the recessed surface. Slurry for metal polishing may be employed as such polishing slurry.

Figure 3F:
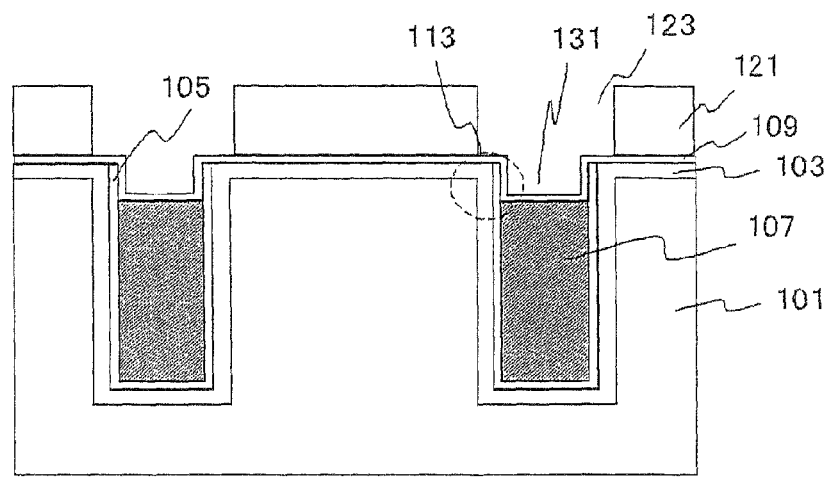

Then, a TiW film, which is to serve as the under bump metal film 109, and a resist film 121 are applied all over the substrate 101, and photolithography is performed to form an opening 123, thus to expose the under bump metal film 109 (FIG. 3F). The opening 123 is located above the through plug 107 as well as the SiN film 105 and the insulative thick film 103 disposed along the side wall of the through plug 107.

Figure 4G:
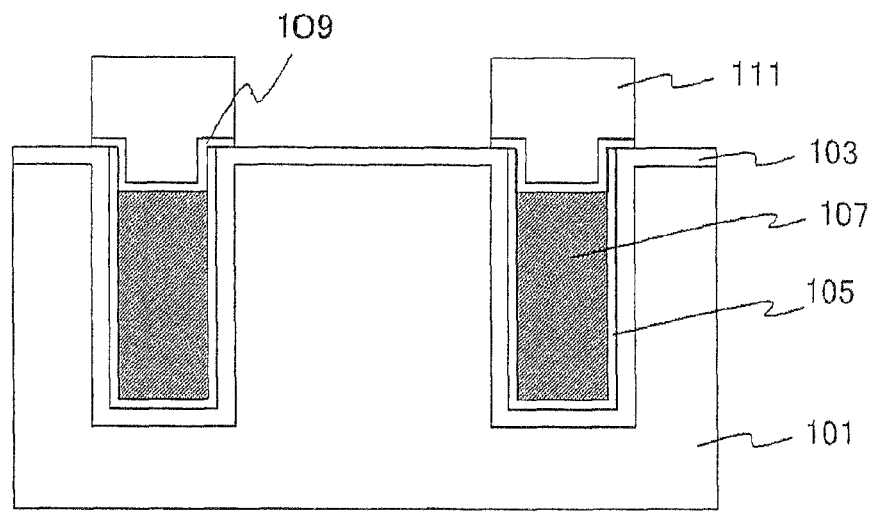
FIGS. 4G and 4H are schematic cross-sectional views for explaining a manufacturing process of the silicon spacer of FIG. 1.

Now electrolytic plating is performed to selectively grow an Au film based on the exposed portion of the under bump metal film 109. The Au film is grown so as to fill the recessed portion 131 and to expand its diameter outside the recessed portion 131, thus to form the first bump 111 that contacts with the insulative thick film 103. The resist film 121 is removed. After that, wet etching is performed utilizing the first bump 111 as a mask, to thereby remove the under bump metal film 109 except a portion formed in the formation region of the first bump 111 (FIG. 4G).

Figure 4H:
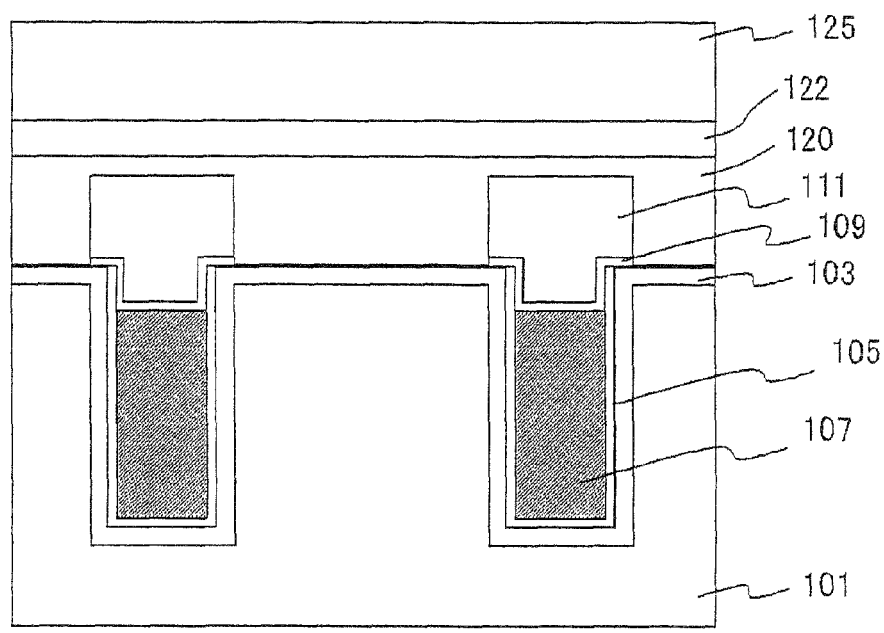

Then the surface of the silicon substrate 101 on which the first bump 111 is provided is adhered to a supporting component 125, via an adhesive 120 and a peeling layer 122 (FIG. 4H). The adhesive 120 may be of a UV-setting material or a thermosetting material. For the peeling layer 122, a material having a different absorption wavelength from that of the adhesive 120, which foams when irradiated by a light of such absorption wavelength. Also, the supporting component 125 may be constituted of a material resistant against heat, chemicals, an external force and the like to be applied thereto during a thinning process of the silicon substrate 101 such as rear face grinding, to be later described. Examples of such material include quartz and a glass such as Pyrex™, though a material other than glass may be employed, including a plastic such as acrylic resin.

Figure 5I:
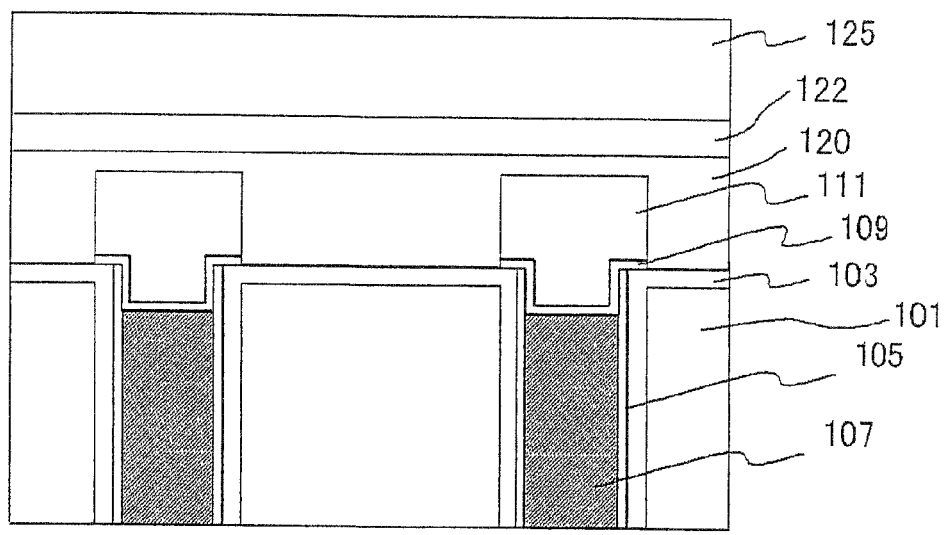
FIG. 5I is a schematic cross-sectional view for explaining a manufacturing process of the silicon spacer of FIG. 1.

Thereafter, the rear face of the silicon substrate 101 is ground (FIG. 5I). The rear face grinding is performed mechanically. A thickness of the silicon substrate 101 after the grinding may be set as for example 50 to 200 μm, depending on the stack configuration of the semiconductor device in which the silicon spacer 100 is to be incorporated.

Then non-electrolytic plating is performed to grow a Ni film on the exposed portion of the through plug 107. Here, the growing condition of the Ni film is adjusted such that the Ni film is formed in an inner region than the contact face between the insulative thick film 103 and the silicon substrate 101, provided on the side wall of the through plug 107. The Ni film is then plated with Au on its surface. At this stage, the second bump 115 is formed on the other face of the through plug 107.

Upon peeling the supporting component 125 from the silicon substrate 101, the supporting component 125 is removed and the silicon spacer 100 as shown in FIG. 1 is obtained.

Now the advantageous effect of the silicon spacer 100 shown in FIG. 1 will be described.

In the silicon spacer 100, the surface of the through plug 107 filled in the through hole of the silicon substrate 101 is located lower in the through hole than the interface between the silicon substrate 101 and the insulative thick film 103, and a height gap 113 is defined between the upper face of the through plug 107 and the contact face between the first bump 111 and the insulative thick film 103. Also, a portion of the first bump 111 is embedded inside the through hole. The first bump 111 has a larger diameter outside the through hole than a diameter inside the through hole, forming an eaves-like projecting shape.

Such configuration of the bump 111, as being connected to the through plug 107 inside the through hole and having a larger diameter outside the through hole than a diameter inside the through hole, provokes an anchoring effect which enhances and stabilizes the adhesion between the bump 111 and the through plug 107. Also, a sufficiently large contact area between the through plug 107 and the first bump 111 provides adequate conductivity therebetween and minimizes a contact resistance. Such configuration also provides stability of the manufacturing process. In addition, because of the presence of the insulative thick film 103, a defect can be effectively prevented, such as emergence of a leak current from the bump 111 on the face of the silicon substrate 101, where is the face of the first bump 111 side.

Further, the height gap 113 can be obtained by appropriately selecting a CMP condition with respect to the Cu film 119. This significantly simplifies the manufacturing process, and also provides stability of the manufacturing process.

Also, the insulative thick film 103, formed between the through plug 107 and the silicon substrate 101 along the side periphery of the through plug 107, is thicker than the SiN film 105. Accordingly, a parasitic capacitance is effectively decreased from being generated in the silicon substrate 101. Such effect becomes more prominent when the insulative thick film 103 has a thickness of 300 nm or greater.

Also, the insulative thick film 103 for protecting the surface of the silicon substrate 101 and sustaining the first bump 111 still remains after the CMP process so as to contact with the larger-diameter portion of the first bump 111. The insulative thick film 103 is originally formed to be thick, and maintains a sufficient thickness even after the CMP process. Therefore, the insulation between the first bump 111 and the silicon substrate 101 can be effectively secured. Such effect becomes more prominent when the insulative thick film 103 has a thickness of 300 nm or greater.

Further, as shown in FIG. 3E, a configuration wherein the surface of the silicon substrate 101 is insulated except the upper face of the through plug 107 is obtained after forming the through plug 107 and before forming the first bump 111, without forming an insulating film on the surface of the silicon substrate 101, or forming a resist pattern with a photoresist for defining an opening on the insulating film at a position corresponding to the upper surface of the through plug 107. Accordingly, the configuration that the manufacturing process of the first bump 111 can be simplified and the relevant manufacturing cost can be reduced is obtained.

Further, in the silicon spacer, since the insulative thick film 103 formed so as to cover the side wall of the through plug 107 is sufficiently insulative thick film, the second bump 115 does not surpass the width of the insulative thick film 103 provided along the side periphery of the through plug 107. Accordingly, the insulation between the rear face of the silicon substrate 101 and the second bump 115 can be effectively secured, without additionally providing an insulating film on the rear surface of the silicon substrate 101 for the insulation therebetween. Consequently, the configuration that the manufacturing process for forming the second bump 115 can be shortened is obtained.

Further, in the silicon spacer 100, as shown in FIG. 2B, the insulative thick film 103 provided on the surface of the silicon substrate 101 and the insulative thick film 103 that covers the side wall of the through hole are continuously and integrally formed. Therefore, this configuration can be obtained with a simple process. In the case where these insulative thick films 103 are separately formed, the thick film may separate in the proximity of a boundary region between the surface of the silicon substrate 101 and the side wall of the through hole. However, forming the both insulative thick films 103 as a continuous and integral film allows preventing such separation, and hence enhances the stability during the manufacturing process.

As described above, the silicon spacer 100 includes the insulative thick film 103 on the surface of the silicon substrate 101 as well as on the side wall of the through hole. Accordingly, there is no need to form insulating films for insulating the silicon substrate 101 from the first bump 111 and from the second bump 115. Therefore, the configuration has no an additional process for forming insulating films and has simplicity of manufacturing the configuration. Also, the presence of the height gap 113 enhances the adhesion between the through plug 107 and the first bump 111, thereby increasing the property as the through electrode.

Figure 6A:
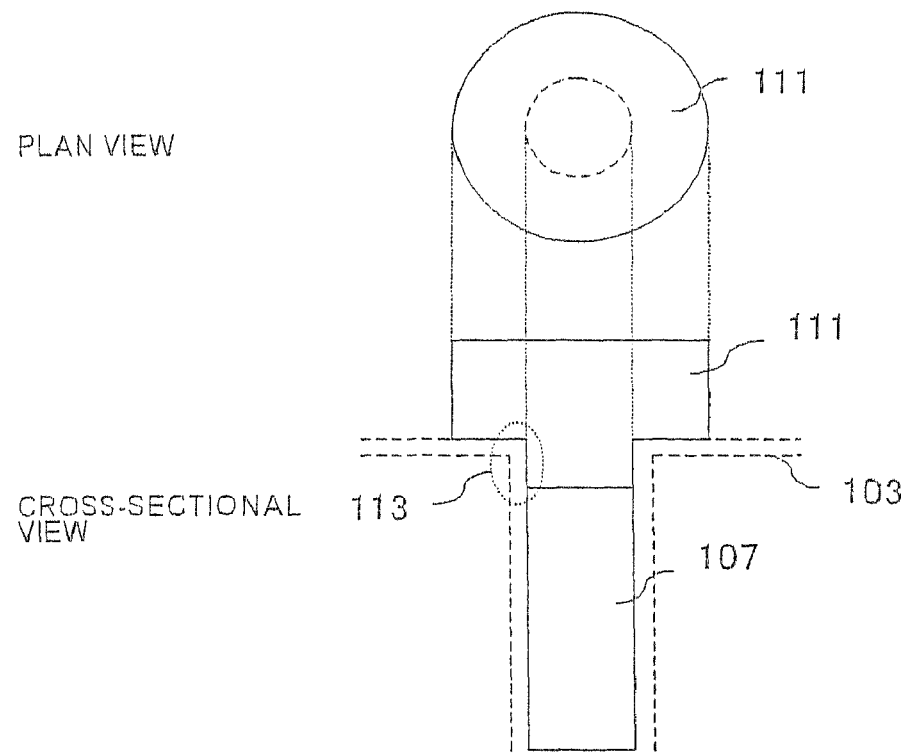
FIGS. 6A and 6B are schematic plan views and cross-sectional views showing a constitution of through electrodes.
Figure 6B:
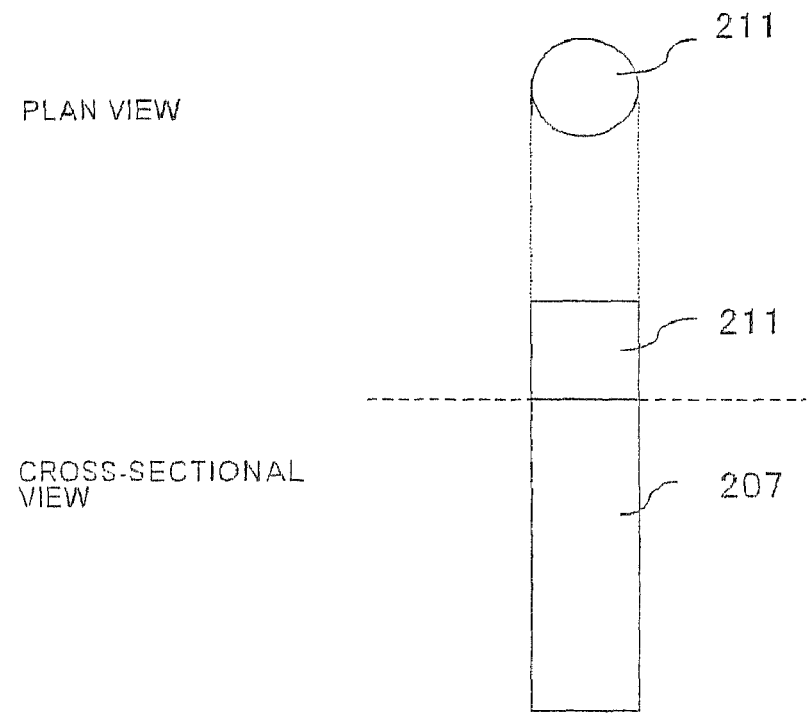

Now, further description will be given regarding the configuration of the through electrode 102 provided in the silicon spacer 100 shown in FIG. 1, in contrast with a conventional through electrode in a semiconductor device disclosed in the foregoing H. Yonemura, et al. FIGS. 6A and 6B are schematic cross-sectional views showing a configuration of the through electrodes. FIG. 6A shows the configuration of the through electrode according to this embodiment, while FIG. 6B shows the configuration of the conventional through electrode.

Referring to FIG. 6B, the upper face of a through plug 207 is aligned with the upper surface of a substrate (dotted line in FIG. 6B) in the conventional through electrode, and it is at this surface that the through plug 207 and the first bump 211 are in mutual contact. On the other hand, referring to FIG. 6A, the upper face of the through plug 107 is located lower than an interface between the silicon substrate 101 and the insulative thick film 103 serving as the protective film for the silicon substrate 101 (dotted line in FIG. 6A) and the height gap 113 is defined, in the through electrode according to this embodiment. Also, a portion of the first bump 111 is embedded in the recessed portion on the through plug 107, thus in contact with the through plug 107. Since the first bump 111 is in contact with the upper face of the thick film and that of the through plug 107, the first bump 111 and the through plug 107 are tightly adhered to each other, thus achieving more secure electrical contact therebetween in comparison with the configuration shown in FIG. 6B.

Further, the configuration of FIG. 6A includes the thick film along the side periphery of the through plug 107, which the configuration of FIG. 6B does not have. Therefore, the through electrode according to this embodiment can decrease a parasitic capacitance more effectively than the conventional through electrode can.

Further, referring to FIG. 6B, in the case where the bump 211 has a larger diameter than that of the through plug 207, an additional process becomes necessary for forming an insulating layer between the substrate and the bump 211. Accordingly, the configuration of FIG. 6A can be manufactured through a fewer number of process than that required by the configuration of FIG. 6B. Therefore, the configuration of the through electrode according to this embodiment allows simplifying the manufacturing process and hence reducing the relevant manufacturing cost. In addition, though not shown in FIGS. 6A and 6B, the second bump 115 of the through electrode according to this embodiment can also be formed through a fewer number of process, than in the case of the conventional through electrode.

Although the present invention has been described based on an embodiment referring to the drawings, it is to be understood that the foregoing is merely an example of the present invention, and that various other constitutions may be adopted.

For example, the height gap 113 in the silicon spacer 100 according to FIG. 1 is vertically formed with respect to the surface of the silicon substrate 101, while a shape of the height gap 113 is not specifically determined but may be otherwise designed, including the shape that is expanded from the inside of the silicon substrate 101 to the outside of the silicon substrate 101. Also, though the retreated face of the through plug 107 is oriented in parallel to the surface of the silicon substrate 101 according to FIG. 1, the retreated face of the through plug 107 may be of a concave curved surface. For example, such shape may be obtained by a dishing effect to form a concave recess on the upper surface of the through plug 107.

Also, the under bump metal film 109 may be constituted of a refractory metal such as Ti, Ta other than TiW. For example, Ti, TiN, WN, Ta, TaN or the like are illustrated. In addition, a Ta containing barrier metal including layers of TaN and Ta may also be employed. The barrier metal film may be formed with sputtering, CVD and the like.

Further, though in FIG. 6A, a circular cylinder shaped through electrode 102 is described as an example, the shape of the through electrode 102 according to this embodiment is not limited to the circular cylinder, but may be another shape as long as the shape allows formation of the height gap 113, such as an elliptic cylinder or a rectangular column having substantially the same area upper face as lower face. Alternatively, the through electrode 102 may be a truncated cone, a truncated elliptic cylinder or a truncated pyramid which does not have a pointed top. The cylinder shape may include a striped shape extending in one direction.

Further, while the foregoing description represents a configuration wherein the through electrode 102 is formed in the silicon spacer 100 as an example, the through electrode 102 may be applied to various other semiconductor chip substrates, other than the silicon spacer 100.

Example

As the example, the silicon spacer 100 shown in FIG. 1 was manufactured according to the process described referring to FIGS. 2A to 2C, 3D to 3F, 4G to 4H and 5I. Here, a $SiO_2$ film of 300 nm in thickness was formed as the insulative thick film 103. The SiN film 105 was formed to have a thickness of 50 nm. The through plug 107 was formed of a Cu film. Also, the silicon substrate 101 was thinned to 200 μm by grinding rear surface of the silicon substrate 101. The silicon spacer 100 including the through electrode 102 was obtained with highly stability of the manufacturing process and an excellent yield.

Comparative Example

Figure 8:
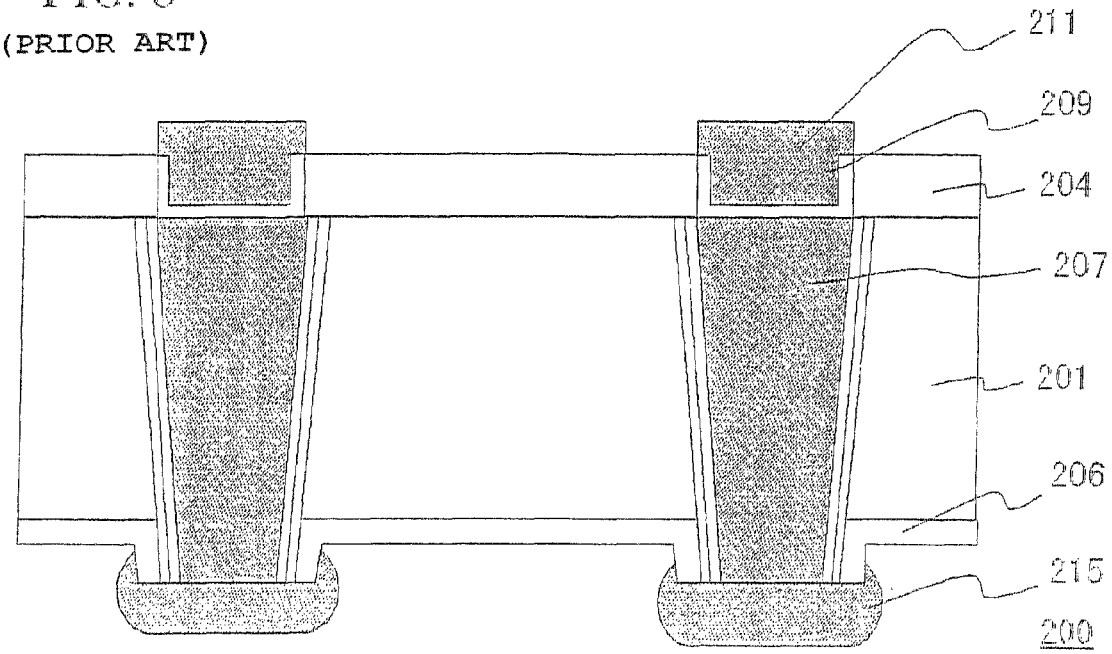
FIG. 8 is a schematic cross-sectional view showing a configuration of a silicon spacer according to a comparative example.

As a comparative example, a silicon spacer including a through electrode was manufactured through a conventional process. FIG. 8 is a schematic cross-sectional view showing a configuration of the silicon spacer manufactured in the comparative example. Also, FIGS. 9A to 9C, 10D to 10F, and 11G to 11H are schematic cross-sectional views for explaining the manufacturing process of a silicon spacer 200 shown in FIG. 8. Hereunder, the manufacturing process of the silicon spacer according to the comparative example will be described, focusing on differences from the foregoing example.

Firstly, a resist pattern was formed on a surface of a silicon substrate 201 by a photolithography technique, and etching was performed utilizing the resist pattern as a mask on the silicon substrate 201, thus to form an opening (not shown in the drawings). Then the resist pattern was removed, and an insulating film 203 and a SiN film 205 was formed in this sequence all over the surface of the silicon substrate 201 on which the opening was provided. A $SiO_2$ film of 10 nm in thickness was formed as the insulating film 203. The SiN film 205 was also formed in a thickness of 10 nm.

Figure 9A:
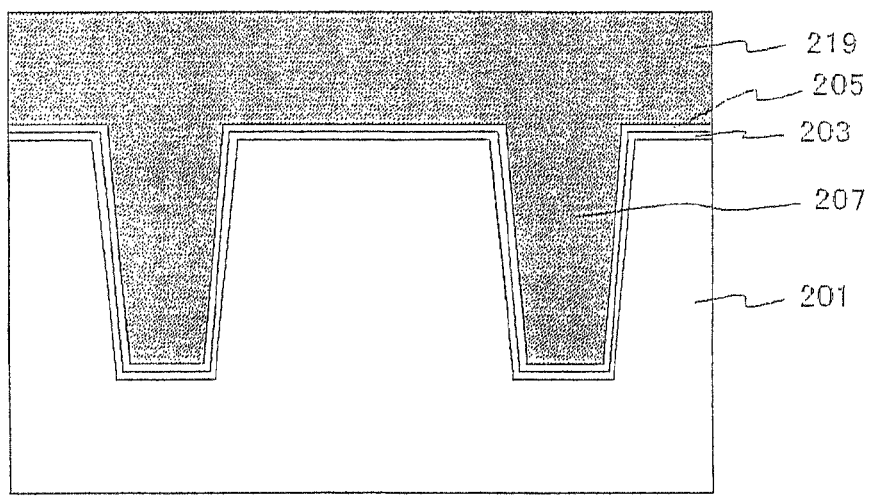
FIGS. 9A to 9C are schematic cross-sectional views for explaining a manufacturing process of the silicon spacer according to the comparative example.
Figure 9B:
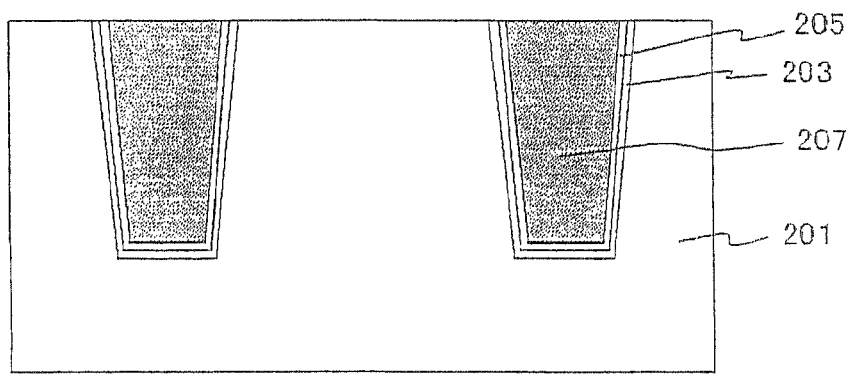

Thereafter, a Cu film 219 was formed so as to fill the opening (FIG. 9A). Then the Cu film 219, the SiN film 205 and the insulating film 203 on the silicon substrate 201 was removed with CMP. At this stage, the CMP condition was adjusted such that a surface of the silicon substrate 201 to be exposed and a surface of the through plug 207 were aligned (FIG. 9B).

Figure 9C:
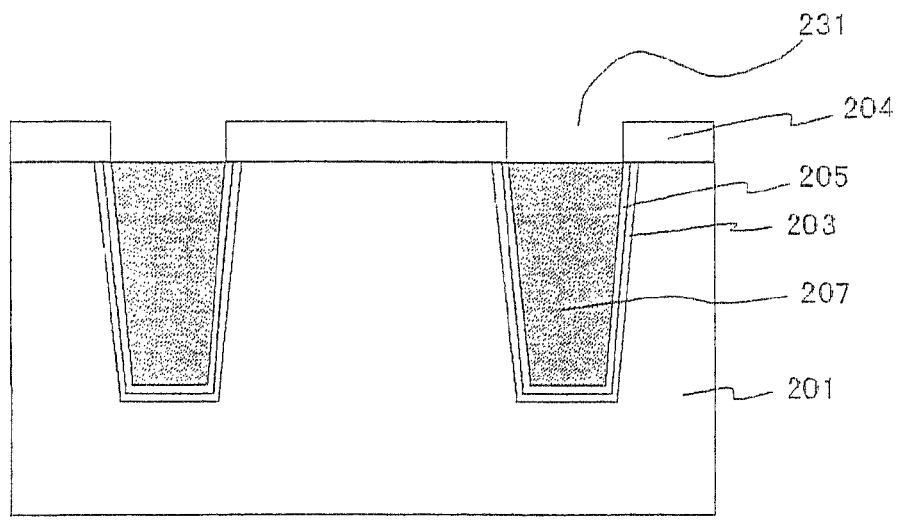

An insulating film 204 was formed in a thickness of 300 nm on the surface of the silicon substrate 201, as a cover film. Then a resist pattern was formed on the insulating film 204, and etching was selectively performed on the insulating film 204 located on the through plug 207, thus to form an opening 231 (FIG. 9C).

Figure 10D:
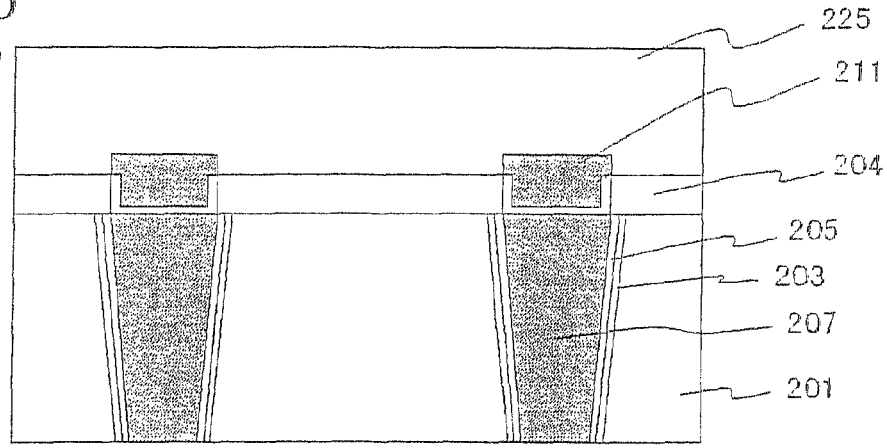
FIGS. 10D to 10F are schematic cross-sectional views for explaining a manufacturing process of the silicon spacer according to the comparative example.
Figure 10E:
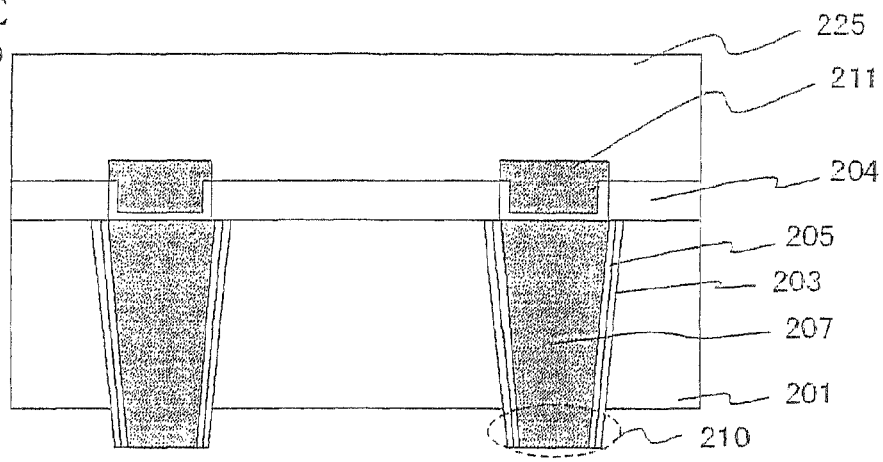

Then a first bump 211 that is connected to the through plug 207 was formed, through the process described referring to FIGS. 3F to 5I, and the surface on the side of the first bump 211 was fixed to a supporting component 225 via an adhesive (not shown in the drawings) and a peeling layer (not shown in the drawings) (FIG. 10D).

Figure 10F:
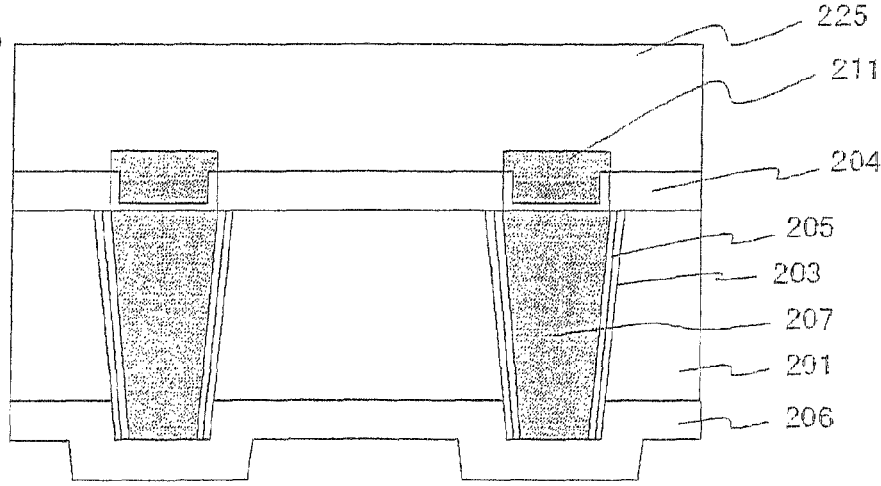
Figure 11G:
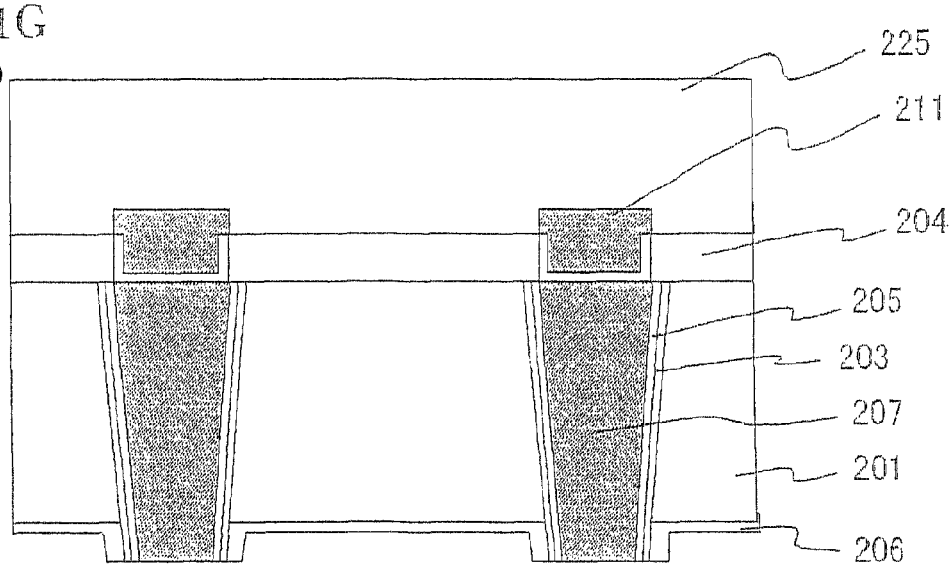
FIGS. 11G and 11H are schematic cross-sectional views for explaining a manufacturing process of the silicon spacer according to the comparative example.
Figure 11H:
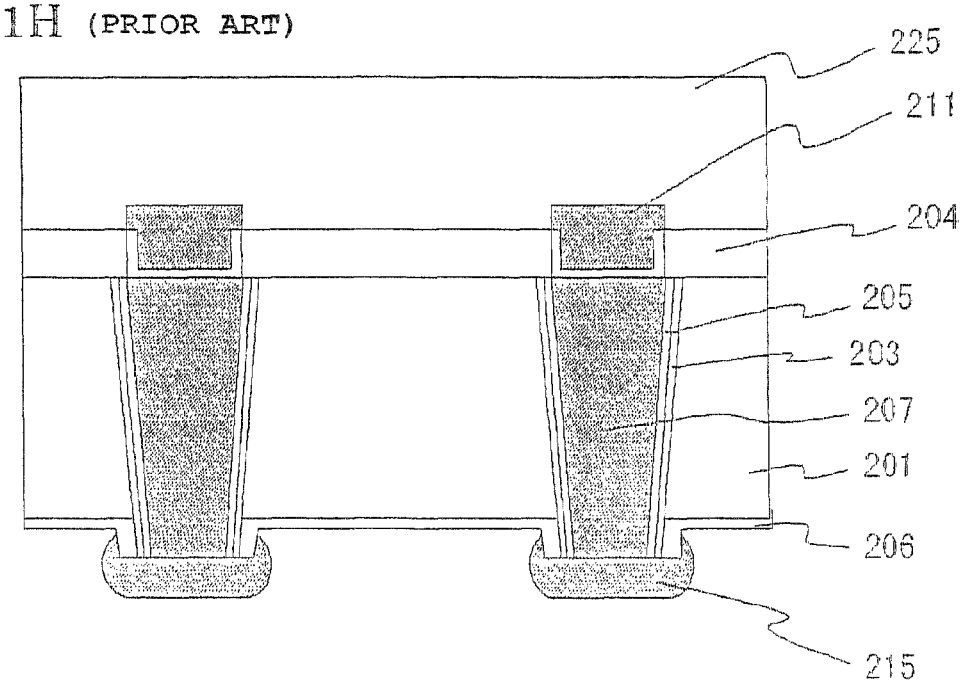

After the above, the rear face of the silicon substrate 201 was ground, so as to expose the lower face of the through plug 207. Then silicon etch back on the rear face was performed, thus to form a Cu post 210 (FIG. 10E), followed by forming an insulating film 206 all over the rear surface, as a cover film. As the insulating film 206, a SiN film of 100 nm in thickness was formed (FIG. 10F). Thereafter, CMP was performed to selectively remove the insulating film 206 on the rear face of the through plug 207, thus to expose the through plug 207 (FIG. 11G). Similarly to the example, non-electrolytic plating was performed to grow an Ni film on the exposed surface of the through plug 207, to thereby form a second bump 215 around the through plug 207 (FIG. 11H). Then an Au plated film was formed on the surface of the Ni film, after which the supporting component 225 was removed, and finally the silicon spacer 200 shown in FIG. 8 was obtained.

Since the comparative example did not include the insulative thick film 103 unlike the example, the silicon spacer 200 according to the comparative example required additional process of forming the insulating film 204 and the insulating film 206 for the insulation of the through plug 207 from the first bump 211 and from the second bump 215, performing selective etching on the insulating film 204 and selectively removing the insulating film 206, resulting in an increase in the number of process in manufacturing.

It is apparent that the present invention is not limited to the above embodiment, that may be modified and changed without departing from the scope and spirit of the invention.

What is claimed is:

1. A method of manufacturing a through electrode, comprising:
    forming a hole on one surface of a silicon substrate;
    forming an insulating film that covers said surface and an inner wall of said hole;
    forming a conductive film so as to fill said hole;
    performing polishing or etching back on said conductive film so as to remove a portion of said conductive film formed outside said hole for exposing said insulating film, and to retreat a surface of said conductive film into an inner level of said silicon substrate than the surface thereof, for forming a conductive plug and a recessed portion;
    growing a metal film on a retreated surface of said conductive plug thus to fill said recessed portion and to further form a bump having a larger diameter outside said hole than that of a portion of said bump located inside said hole; and
    polishing another surface of said silicon substrate for exposing said conductive plug, thus to form a through electrode,
    wherein said forming said bump includes forming a barrier metal film on the surface of said conductive plug and a side wall of said recessed portion, and growing said metal film utilizing said barrier metal film as a base.

2. The method according to claim 1, comprising, after said forming said conductive plug:
    selectively removing a portion of said silicon substrate from said another surface thereof opposite to said one surface thus to expose a surface of said conductive plug; and
    growing another metal film on an exposed surface of said conductive plug, thus to form a bump on the rear surface.

3. The method according to claim 1, comprising, after said forming said through electrode:
    growing another metal film on an exposed surface of said conductive plug, thus to form a bump on the rear surface.

4. The method according to claim 1, wherein said forming said insulating film includes forming a silicon oxide film on said one surface of said silicon substrate.

5. The method according to claim 1, comprising forming a barrier film on said one surface of said silicon substrate provided with said hole, after said forming said insulating film and before said forming said conductive film.

* * * * *